(12) United States Patent
Wichowski et al.

(10) Patent No.: US 10,289,092 B2
(45) Date of Patent: May 14, 2019

(54) DIGITAL MOTOR CONTROLLER STABILITY ANALYSIS TOOL

(71) Applicant: HAMILTON SUNDSTRAND SPACE SYSTEMS INTERNATIONAL, INC., Windsor Locks, CT (US)

(72) Inventors: Robert P. Wichowski, Westfield, MA (US); Kevin G. Hawes, Windsor Locks, CT (US); Michael A. O'Toole, Seymour, CT (US)

(73) Assignee: HAMILTON SUNDSTRAND SPACE SYSTEMS INTERNATIONAL INC., Windsor Locks, CT (US)

( * ) Notice: Subject to any disclaimer, the term of this patent is extended or adjusted under 35 U.S.C. 154(b) by 313 days.

(21) Appl. No.: 14/995,691

(22) Filed: Jan. 14, 2016

(65) Prior Publication Data
US 2017/0205794 A1    Jul. 20, 2017

(51) Int. Cl.
*G05B 19/042* (2006.01)
*G05B 19/045* (2006.01)
*G06F 17/50* (2006.01)

(52) U.S. Cl.
CPC ....... *G05B 19/0428* (2013.01); *G05B 19/045* (2013.01); *G06F 17/5054* (2013.01); *G05B 2219/21109* (2013.01)

(58) Field of Classification Search
CPC .............. G05B 19/0428; G05B 19/045; G05B 2219/21109; G06F 17/5054
See application file for complete search history.

(56) References Cited

U.S. PATENT DOCUMENTS

| | | | |
|---|---|---|---|
| 6,834,360 B2 | 12/2004 | Corti et al. | |
| 7,362,070 B2 * | 4/2008 | Games | H02P 6/18 318/600 |
| 8,049,448 B2 | 11/2011 | Yang et al. | |
| 8,174,222 B2 | 5/2012 | Patel et al. | |
| RE45,388 E | 2/2015 | Wichowski et al. | |
| 9,059,732 B2 | 6/2015 | Courtney | |
| 2004/0150362 A1 | 8/2004 | Simmons et al. | |
| 2004/0174126 A1 | 9/2004 | Chapman et al. | |

(Continued)

OTHER PUBLICATIONS

Extended European Search Report for EP Application No. 17151358. 3-1802, dated May 30, 2017, pp. 1-7.

*Primary Examiner* — Tri M Hoang
(74) *Attorney, Agent, or Firm* — Cantor Colburn LLP

(57) ABSTRACT

A computer-implemented method for performing stability analysis for a digital motor controller includes receiving a reference signal to be injected into a digital speed control loop and controlling, by a hardware description language (VHDL) component, the injection of the reference signal into the digital control loop through a field programmable gate array (FPGA) hardware interface. The method also includes providing the reference signal to the digital speed control loop to determine a performance of the digital motor controller and receiving a feedback signal, at the FPGA hardware interface, from the digital speed control loop based on the reference signal. The method includes comparing the reference signal to the feedback signal to evaluate the performance of the digital motor controller and exporting a result of the comparing by the FPGA hardware interface to indicate the performance of the digital motor controller.

12 Claims, 2 Drawing Sheets

(56) References Cited

U.S. PATENT DOCUMENTS

| | | |
|---|---|---|
| 2007/0241712 A1 | 10/2007 | Dwyer et al. |
| 2011/0006713 A1 | 1/2011 | Wichowski |
| 2014/0239864 A1* | 8/2014 | Hansen .................... H02P 7/06 318/400.35 |
| 2015/0097709 A1* | 4/2015 | Courtney .............. H03M 1/485 341/116 |

* cited by examiner

DIGITAL MOTOR CONTROLLER STABILITY ANALYSIS TOOL

BACKGROUND

The present disclosure relates to digital motor controllers, and more specifically, to a digital motor controller stability analysis tool.

Performing stability analysis is essential to determining how efficient a motor controller is operating. Previously stability analysis of analog motor controllers was executed based on determining an error voltage that was being measured in the speed control loop in response to a speed command. However in today's environment digital motor controllers are being used which makes measuring the system's stability more difficult. Present tools lack the ability to determine the stability of these digital systems.

SUMMARY

In accordance with an embodiment of the invention, a computer-implemented method for performing stability analysis for a digital motor controller, the method includes receiving a reference signal to be injected into a digital speed control loop and controlling, by a hardware description language (VHDL) component, the injection of the reference signal into the digital control loop through a field programmable gate array (FPGA) hardware interface. The method further includes providing the reference signal to the digital speed control loop to determine a performance of the digital motor controller and receiving a feedback signal, at the FPGA hardware interface, from the digital speed control loop based on the reference signal. The method includes comparing the reference signal to the feedback signal to evaluate the performance of the digital motor controller and exporting a result of the comparing by the FPGA hardware interface to indicate the performance of the digital motor controller.

In accordance with an embodiment of the invention a system for performing stability analysis for a digital motor controller, the system includes a digital motor controller and a field programmable gate array (FPGA) hardware interface that receives a reference signal to be injected into a digital speed control loop. The system further controls, by a hardware description language (VHDL) component, the injection of the reference signal into the digital control loop through the FPGA hardware interface and provides the reference signal to the digital speed control loop to determine a performance of the digital motor controller. The system also receives a feedback signal, at the FPGA hardware interface, from the digital speed control loop based on the reference signal and compares the reference signal to the feedback signal to evaluate the performance of the digital motor controller. The system exports a result of the comparing by the FPGA hardware interface to indicate the performance of the digital motor controller.

In accordance with an embodiment of the invention a non-transitory computer readable medium storing computer program code, the computer program code includes instructions executable by a processor method for performing stability analysis for a digital motor control, the computer readable medium includes receiving a reference signal to be injected into a digital speed control loop and controlling, by a hardware description language (VHDL) component, the injection of the reference signal into the digital control loop through a field programmable gate array (FPGA) hardware interface. The computer readable medium further includes providing the reference signal to the digital speed control loop to determine a performance of the digital motor controller and receiving a feedback signal, at the FPGA hardware interface, from the digital speed control loop based on the reference signal. The computer readable medium includes comparing the reference signal to the feedback signal to evaluate the performance of the digital motor controller and exporting a result of the comparing by the FPGA hardware interface to indicate the performance of the digital motor controller.

These and other advantage and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION

In accordance with embodiments of the disclosure, a method, system, and computer readable medium for a digital motor controller stability analysis tool has been provided. In an embodiment the controller is a FPGA based motor controller. A field programmable gate array (FPGA) is a semiconductor device having programmable logic components and programmable interconnects. These components can be programmed to duplicate the functionality of basic logic gates or more complex combinational functions. Very high speed integrated circuit hardware description language (VHDL) is code written to provide a high level hardware description of operation of the device. VHDL is often used as a design-entry language for FPGAs an in electronic design automation of digital circuits. The VHDL code is then synthesized to form hardware definitions. These hardware definitions are then decomposed or mapped to the actual FPGA circuitry. In an embodiment the digital motor controller is an FPGA based motor controller including a VHDL component.

In one embodiment a VHDL component within the FPGA allows an external digital reference signal to be injected into the digital speed feedback of a digital speed control loop. The time domain characteristics of the injected signal and the speed feedback will be exported out of the FPGA on a dedicated interface. In other embodiments the digital sinusoidal noise signal can be generated within the motor controller. In some embodiments the control loop is a digital speed control loop that is used for controlling a motor's speed. The noise signal is injected into the feedback of the digital speed control loop for analyzing the performance of the system and information indicating its response to the signal is returned to the digital motor controller. In some embodiments the time characteristics of the injected reference signal and the speed feedback signal can be exported to analyze the gain and phase margins associated with the system. In another embodiment a VHDL component is included to embed within the motor controller the capability to run these test or externally and inject a signal through the interface to gather the stability information.

Figure 1:
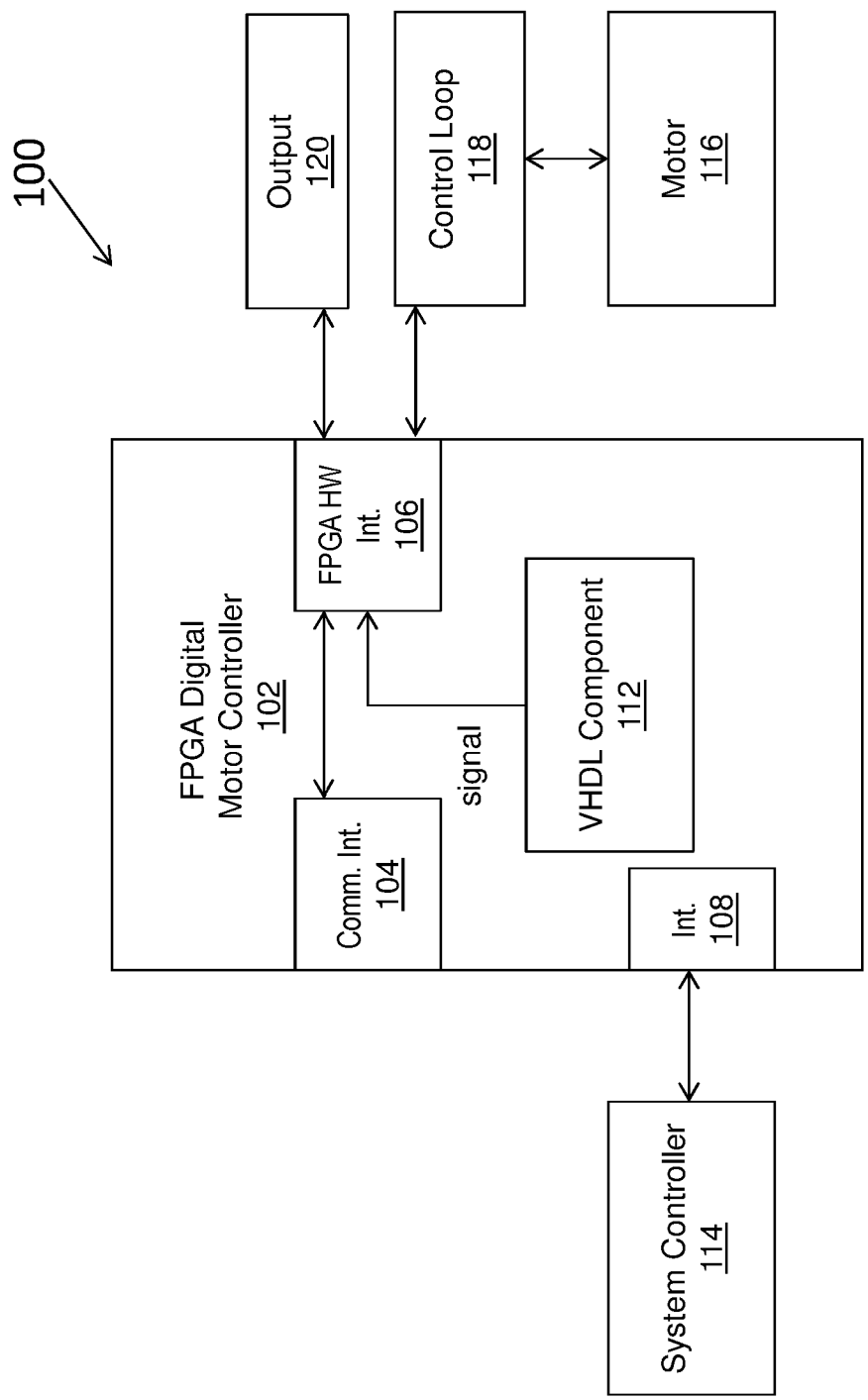
FIG. 1 is a block diagram illustrating one example of a processing system for practice of the teachings herein.

Referring to FIG. 1, there is shown an embodiment of a system 100 for implementing the teachings herein. The system 100 includes field programmable gate array (FPGA) digital motor controller 102 for controlling a motor 116. The system 100 further includes a system controller 114, which is coupled to FPGA digital motor controller 102 and communicates with the FPGA 102 through interface 108. In an embodiment, the system controller 114 is capable of configuring the FPGA digital motor controller 102. In another embodiment the communication interface 104 is configured to receive a signal from a system external to the system 100. In some embodiments the received signal is a digital sinusoidal noise signal to be provided to the control loop 118 where the digital sinusoidal noise signal is a digital representation of a sinusoidal signal that is used for a reference signal. The characteristics of the signal, such as amplitude, phase, and frequency, are known prior to be injected into the control loop 118. The communication interface 104 is coupled to the FPGA hardware interface 106 where the FPGA hardware interface 106 is coupled to the output 120 and control loop 118. In some embodiments the FPGA hardware interface 106 is a dedicated interface. FIG. 1 further depicts a VHDL component 112 which allows the digital sinusoidal noise signal to be injected into the feedback of the control loop. In an embodiment, the VHDL component 112 is configured to generate an internal signal to be provided to the control loop 118 through the FPGA hardware interface 106.

In an embodiment the control loop 118 is a digital speed control loop for controlling motor 116. The injected sinusoidal signal, which is generated either internally or externally, is provided to the digital speed feedback of the digital speed control loop and is used to determine the performance of the system. The FPGA hardware interface 106 is further configured to export time domain characteristics of the injected reference signal and the speed feedback signal from the control loop outside of the FPGA. This information allows for the stability analysis to be performed. This information can be used to generate a "Bode Plot" of the motor system while the digital motor controller is under operation or during testing, where phase and gain margins will be available for verification of stability over a range of frequencies.

Figure 2:
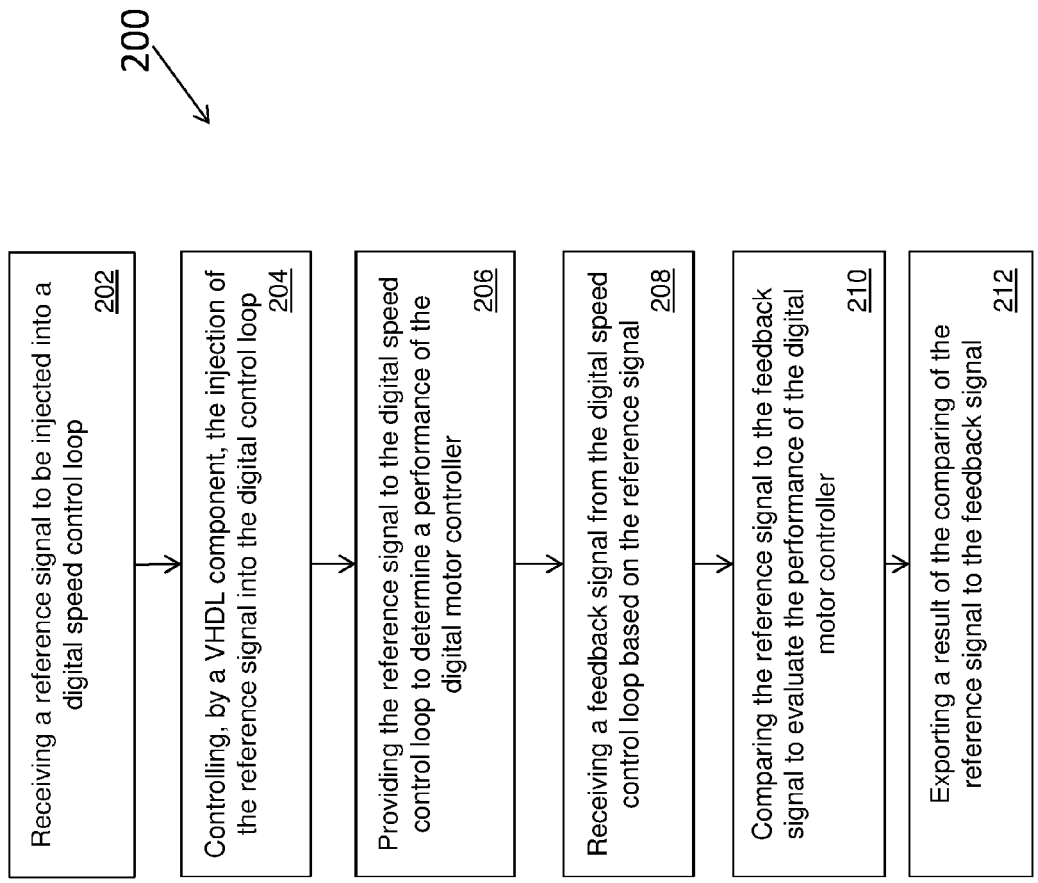
FIG. 2 is a flow diagram for performing stability analysis for a digital motor controller.

Referring to FIG. 2, there is shown a flow diagram 200 for performing stability analysis for a digital motor controller. Block 202 of FIG. 2 illustrates receiving a signal to be injected into a digital speed control loop. In an embodiment the signal that is injected into the digital control loop can be generated within the FPGA. In another embodiment the signal can be received at a communication interface from a source external to the FGPA motor controller and input into the digital control loop. Block 204 includes controlling, by a hardware description language (VHDL) component, the injection of the reference signal into the digital control loop through a field programmable gate array (FPGA) hardware interface. In an embodiment the signal is a digital sinusoidal noise signal and is used to obtain feedback information indicating a performance of the digital motor controller.

FIG. 2 provides in block 208 receiving a feedback signal, at the FPGA hardware interface, from the digital speed control loop based on the reference signal. Block 210 includes comparing the reference signal to the feedback signal to evaluate the performance of the digital motor controller. Block 212 provides exporting a result of the comparing by the FPGA hardware interface to indicate the performance of the digital motor controller. The feedback information can be exported out of the digital motor controller and used to generate bode plots to analyze the stability of the system.

The disclosure is relevant to obtaining the digital feedback response to determine the performance or operability for various control systems and controllers such as international space stations, pump controllers, water systems, etc. The signal that is injected into the control loop provides a reference signal with known properties is used for determining the stability of the system. After feedback is received from the from the control loop responsive to the injected signal, the characteristics of the injected signal is compared to the feedback signal. The characteristics that are evaluated include the gain and phase shift which are indicative of how efficient the system is operating. These characteristics can be output of the FPGA and used to generate bode plots representing the stability of the control systems.

Although the FPGA-based digital motor controller is depicted as a single block in FIG. 1, it will be understood that the functionality implemented within the FPGA-based digital motor controller can be distributed over multiple FPGAs. FPGAs are semiconductor devices that can be configured after manufacturing according to hardware description language (HDL) files. HDL files may be implemented in a variety of formats, such as very high-speed integrated circuit hardware description language (VHDL) and/or Verilog files. As used herein, the term "FPGA" can refer to any programmable logic device capable of performing closed-loop digital motor control absent software execution.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A computer-implemented method for performing stability analysis for a digital motor controller, the method comprising:
    internally generating a reference signal to be injected into a digital speed control loop;
    controlling, by a hardware description language (VHDL) component, the injection of the reference signal into the digital speed control loop through a field programmable gate array (FPGA) hardware interface;
    providing the reference signal to the digital speed control loop to determine a performance of the digital motor controller, wherein the reference signal is a sinusoidal noise signal;
    receiving a feedback signal, at the FPGA hardware interface, from the digital speed control loop based on the reference signal;
    comparing the reference signal to the feedback signal to evaluate the performance of the digital motor controller; and
    exporting a result of the comparing by the FPGA hardware interface to indicate the performance of the digital motor controller.

2. The method of claim 1, wherein the reference signal is a digital signal.

3. The method of claim 2, wherein the digital signal is generated within the digital motor controller and is controlled by the VHDL component, wherein the VHDL component is embedded within the digital motor controller.

4. The method of claim 1, wherein the exported result includes time domain characteristics of the reference signal and the feedback signal from the digital speed control loop.

5. A system for performing stability analysis for a digital motor controller, the system comprising:
    a digital motor controller;
    a field programmable gate array (FPGA) hardware interface that internally generates a reference signal to be injected into a digital speed control loop;

controls, by a hardware description language (VHDL) component, the injection of the reference signal into the digital speed control loop through the FPGA hardware interface;

provides the reference signal to the digital speed control loop to determine a performance of the digital motor controller, wherein the reference signal is a sinusoidal noise signal;

receives a feedback signal, at the FPGA hardware interface, from the digital speed control loop based on the reference signal;

compares the reference signal to the feedback signal to evaluate the performance of the digital motor controller; and exports a result of the comparing by the FPGA hardware interface to indicate the performance of the digital motor controller.

6. The system of claim 5, wherein the reference signal is a digital signal.

7. The system of claim 6, wherein the digital signal is generated within the digital motor controller and is controlled by the VHDL component, wherein the VHDL component is embedded within the digital motor controller.

8. The system of claim 5, wherein the exported result includes time domain characteristics of the reference signal and feedback signal information from the digital speed control loop.

9. A non-transitory computer readable medium storing computer program code, the computer program code comprising instructions executable by a processor for performing stability analysis for a digital motor controller, the instructions comprising:

internally generating a reference signal to be injected into a digital speed control loop, wherein the reference signal is a sinusoidal noise signal;

controlling, by a hardware description language (VHDL) component, the injection of the reference signal into the digital speed control loop through a field programmable gate array (FPGA) hardware interface;

providing the reference signal to the digital speed control loop to determine a performance of the digital motor controller;

receiving a feedback signal, at the FPGA hardware interface, from the digital speed control loop based on the reference signal; comparing the reference signal to the feedback signal to evaluate the performance of the digital motor controller; and exporting a result of the comparing by the FPGA hardware interface to indicate the performance of the digital motor controller.

10. The computer readable medium of claim 9, wherein the reference signal is a digital signal.

11. The computer readable medium of claim 9, wherein the digital signal is generated within the digital motor controller and is controlled by the VHDL component, wherein the VHDL component is embedded within the digital motor controller.

12. The computer readable medium of claim 9, wherein the exported result includes time domain characteristics of the reference signal and feedback signal from the digital speed control loop.

* * * * *